US010038407B2

(12) United States Patent
Moronval et al.

(10) Patent No.: US 10,038,407 B2
(45) Date of Patent: Jul. 31, 2018

(54) INTEGRATED 3-WAY DOHERTY AMPLIFIER

(71) Applicant: Ampleon Netherlands B.V., Nijmegen (NL)

(72) Inventors: Xavier Moronval, Nijmegen (NL); Jean-Jacques Bouny, Nijmegen (NL); Gerard Bouisse, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 0 days.

(21) Appl. No.: 15/502,151

(22) PCT Filed: Aug. 7, 2015

(86) PCT No.: PCT/EP2015/068270
§ 371 (c)(1),
(2) Date: Feb. 6, 2017

(87) PCT Pub. No.: WO2016/020531
PCT Pub. Date: Feb. 11, 2016

(65) Prior Publication Data
US 2017/0230009 A1    Aug. 10, 2017

(30) Foreign Application Priority Data

Aug. 7, 2014    (EP) .................................... 14290235

(51) Int. Cl.
*H03F 3/68*    (2006.01)
*H03F 1/02*    (2006.01)
(Continued)

(52) U.S. Cl.
CPC ..... *H03F 1/0288* (2013.01); *H01L 23/49537* (2013.01); *H01L 23/552* (2013.01);
(Continued)

(58) Field of Classification Search
CPC ........... H03F 3/191; H03F 1/0288; H03F 3/68
(Continued)

(56) References Cited

U.S. PATENT DOCUMENTS

| | | | |
|---|---|---|---|
| 7,884,668 B2* | 2/2011 | Blednov | ............... H03F 1/0288 330/124 R |
| 2016/0142025 A1* | 5/2016 | Volokhine | ............... H03F 1/565 330/307 |

FOREIGN PATENT DOCUMENTS

EP    2458730 A1    5/2012

OTHER PUBLICATIONS

Kyoung-Joon Cho et al.: "N-Way Distributed Doherty Amplifier with an Extended Efficiency Range," Microwave Symposium, 2007. IEEE/MTT-S International, IEEE, PI, Jun. 3, 2007, pp. 1581-1584.

(Continued)

*Primary Examiner* — Steven J Mottola
(74) *Attorney, Agent, or Firm* — McDonnell Boehnen Hulbert & Berghoff LLP

(57) ABSTRACT

A die is described comprising at least one 3-way Doherty amplifier comprising a main stage, a first peak stage and a second peak stage. An input is connected to an input network which is connected to the main stage, first peak stage and second peak stage. The input network includes a first impedance connected to an input of the first peak stage and providing a −90° phase shift and a second impedance connected to an input of the second peak stage and providing a 90° phase shift. An output is connected to an output network which is connected to the main stage, first peak stage and second peak stage. The output network includes a third impedance connected to the output of the first peak (Continued)

stage and providing a 180° phase shift and a fourth impedance connected to the output of the main stage and providing a 90° phase shift.

10 Claims, 6 Drawing Sheets

(51) Int. Cl.
    *H03F 3/24*     (2006.01)
    *H03F 3/195*     (2006.01)
    *H01L 23/552*     (2006.01)
    *H01L 23/495*     (2006.01)
    *H01L 23/00*     (2006.01)
    *H01L 23/66*     (2006.01)
    *H04W 52/52*     (2009.01)

(52) U.S. Cl.
    CPC .............. *H01L 23/66* (2013.01); *H01L 24/06* (2013.01); *H01L 24/46* (2013.01); *H03F 3/195* (2013.01); *H03F 3/245* (2013.01); *H01L 2223/6611* (2013.01); *H01L 2223/6644* (2013.01); *H01L 2224/04042* (2013.01); *H03F 2200/225* (2013.01); *H03F 2200/36* (2013.01); *H03F 2200/391* (2013.01); *H03F 2200/451* (2013.01); *H04W 52/52* (2013.01)

(58) Field of Classification Search
    USPC ........................................................ 330/295
    See application file for complete search history.

(56) References Cited

OTHER PUBLICATIONS

Eccleston K. W.: "Analysis of a multi-transistor interleaved Doherty amplifier," Microwave Conference, 2009. APMC 2009. Asia Pacific, IEEE, Piscataway, NJ, USA, Dec. 7, 2009, pp. 1581-1584.
International Application No. PCT/EP2015/068270, International Search Report and Written Opinion of the International Searching Authority, dated Nov. 17, 2015 (11 pages).

* cited by examiner

INTEGRATED 3-WAY DOHERTY AMPLIFIER

This application is a National Stage Application of International Patent Application No. PCT/EP2015/068270, filed Aug. 7, 2015, which claims the benefit of, and priority to, European Patent Application No. 14290235.2, filed Aug. 7, 2014, the contents of these applications being incorporated entirely herein by reference.

The present invention relates to electronic amplifiers in particular to an integrated 3-way Doherty amplifier.

Electrical amplifiers, and in particular power amplifiers, have a wide range of applications. One particular application is in base stations for cellular or 'mobile' communications networks. Various specific Doherty amplifier topologies, exist including the classical two-way Doherty amplifier and also the three-way Doherty amplifier.

The Doherty amplifier topology is sometimes used in base stations to improve the efficiency of power amplifiers in back-off operation. Operating an amplifier in back-off is generally known in the art and involves reducing the amplifier's maximum output power level so that all the output signal is within the linear region of operation of the amplifier. However, a consequence of operating in back-off is that the amplifier's efficiency is decreased.

Amplifiers with a high bandwidth can be useful in a number of applications. For example, the allocated bands for base stations of some cellular networks range from 0.7 GHz to 3.8 GHz and have related bandwidths of about 5%. The conventional 2-way Doherty topology has a bandwidth limit of about 5% and so a separate Doherty topology would need to be used for each communication band, e.g. the 1.805-1.88 GHz, 1.93-1.99 GHz and 2.11-2.17 GHz bands.

WO 2008/062371 describes an integrated Doherty type amplifier arrangement with high power efficiency. A plurality of unit cells, each comprising a two-way Doherty topology, are arranged in parallel.

Using this approach, the 8 dB back-off efficiency is in the range of about 42% for each of the three communications bands. Although this efficiency is in line with expectations for a symmetric Doherty, it is not at the levels of efficiency of up to 50% in a single band that can be achieved by more complex Doherty topologies, such as asymmetric or 3-way.

WO 2009/081341 describes a 3-way Doherty amplifier in which the outputs of the main stage, first peak stage and second peak stage are combined so as to enable load-line modulation over the full dynamic range of the main amplifier to avoid severe non-linear behaviour. This enables an efficiency response with two maxima at different levels of back-off (6 dB and 9.5 dB) providing a significant efficiency improvement in the 8 dB back-off region compared to a classical two-way Doherty that has only a single efficiency maximum at 6 dB back-off.

Hence, an amplifier with both wideband capability and good efficiency would be beneficial. However, providing more complex Doherty topologies, such as asymmetric or three-way, as an integrated circuit is difficult in practice.

According to a first aspect of the invention, there is provided a die comprising at least one 3-way Doherty amplifier, the 3-way Doherty amplifier comprising: a main stage; a first peak stage; a second peak stage; an input connected to an input network which is connected to the main stage, first peak stage and second peak stage, wherein the input network includes a first impedance connected to an input of the first peak stage and providing a −90° phase shift and a second impedance connected to an input of the second peak stage and providing a 90° phase shift; and an output connected to an output network which is connected to the main stage, first peak stage and second peak stage, wherein the output network includes a third impedance connected to the output of the first peak stage and providing a 180° phase shift and a fourth impedance connected to the output of the main stage and providing a 90° phase shift.

The arrangement of phase shifting elements in the 3-way Doherty topology allows the efficiency performance of a 3-way Doherty topology to be realised more easily as an integrated circuit device.

The output network may not include an impedance providing phase shifting between the output of the second peak stage and the output of the amplifier. Or put another way, the output network may include impedances causing phase shifting only between the output of the main stage and the output of the amplifier and between the output of the first peak stage and the output of the amplifier. This may facilitate integration of the 3-way Doherty amplifier by reducing any mutual coupling effects between impedances provided for phase shifting purposes to allow Doherty type behaviour in the output network.

The third impedance may comprise at least one first bond wire, or a first array of bond wires, connected between an output of the first peak stage and the output of the amplifier. The fourth impedance may comprise at least one second bond wire, or a second array of bond wires, connected between an output of the main stage and the output of the amplifier. Bond wires provide phase shifting elements which are easy to fabricate as part of an integrated circuit.

The at least one first bond wire, or first array of bond wires, may be longer than the at least one second bond wire, or second array of bond wires. The first bond wire, or array of bond wires, may have a higher inductance and therefore cause a greater phase shift, than the second bond wire, or array of bond wires.

The first peak stage may be located closer to the input of the amplifier than the second peak stage and the main stage may be located between the first peak stage and the second peak stage. This arrangement may permit the input and output portions of the amplifier to be organized to help reduce die size and/or improve performance. Gain may be improved by a low input loss and efficiency may be higher owing to reduced output coupling. The third impedance and fourth impedance may both present the same impedance. The impedance of the third impedance and the impedance of the fourth impedance may both be three times the impedance of a load.

The first impedance may include a capacitor. This may increase the gain of the amplifier at its working frequencies as a capacitor may introduce less loss than other types of integrated passive components, such as an inductor.

The integrated 3-way Doherty amplifier may have a fractional bandwidth of greater than 5%. The fractional bandwidth may be between 5% and 20%, and in particular between 10% and 20%. The fractional bandwidth may be, or may be up to, 20%. A fractional bandwidth of about 20% may be useful in a number of telecommunications applications.

The bandwidth of the amplifier may extend from about 1.8 GHz to about 2.2 GHz. This bandwidth may be useful in a number of telecommunications applications.

The die may comprise a further 3-way Doherty amplifier. The further 3-way Doherty amplifier may be the same as the 3-way Doherty amplifier but may have a mirror image arrangement. Providing more than one 3-way Doherty amplifier on the die may increase the electrical power that the die can handle.

A second aspect of the invention provides an amplifier package comprising: an input lead frame; an output lead frame; and a die according to the preceding aspect of the invention and any preferred features thereof.

A third aspect of the invention provides a power amplifier including one or a plurality of amplifier packages according to the preceding aspect of the invention.

A fourth aspect of the invention provides a telecommunications base station including one or a plurality of power amplifiers according to the preceding aspect of the invention.

An embodiment of the invention will now be described, by way of example only, and with reference to the accompanying drawings, in which.

Figure 1:
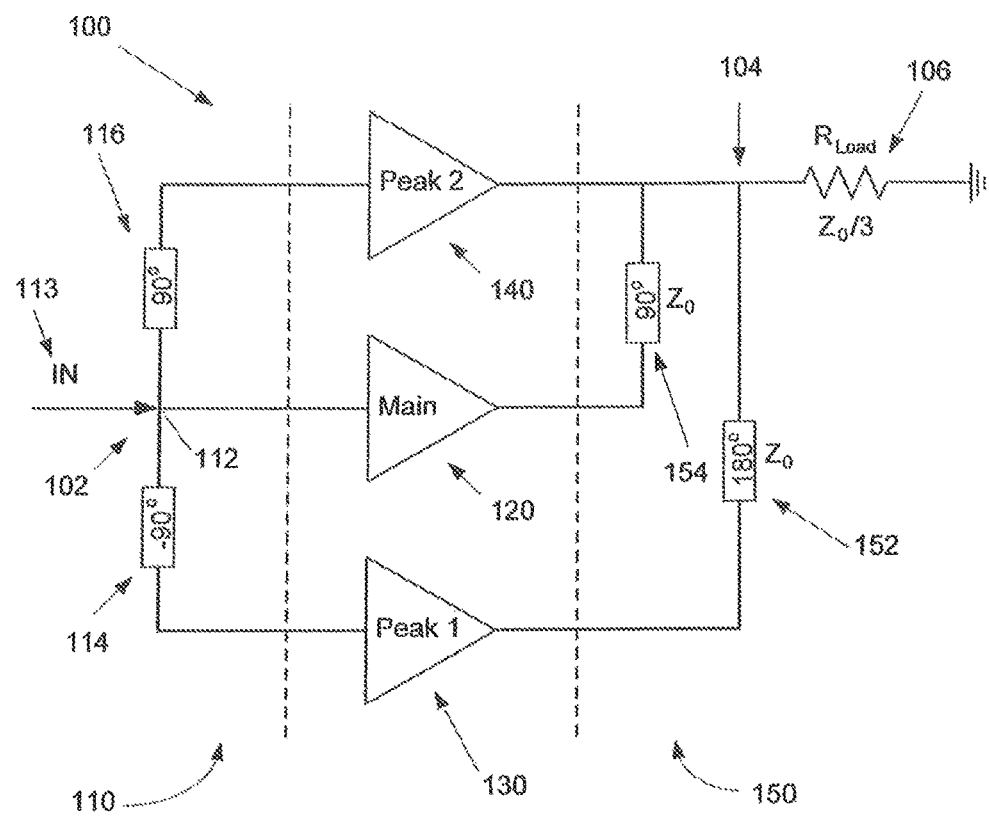
FIG. 1 shows a schematic circuit diagram of a 3-way Doherty amplifier of the invention.

In the drawings, like items in different Figures share common reference numerals unless indicated otherwise.

An embodiment of the invention is described below in relation to the frequency band of approximately 1.8 to 2.2 GHz as commonly used currently in a number of cellular communications standards. However, the invention is not limited to that particular range of frequencies but is applicable to other frequencies also.

With reference to FIG. 1, there is shown a schematic circuit diagram of a 3-way Doherty topology of an amplifier 100 according to the invention. The amplifier 100 includes an input 102 and an output 104 which is attached to a load 106, represented by load resistance $R_{Load}$, which in turn is connected to ground 108. The load 106 has an impedance at the operating frequency of the amplifier of $Z_0/3$. The amplifier 100 generally has a 3-way Doherty topology which is particular suitable for realisation as an integrated circuit as described in greater detail below.

The amplifier 100 includes an input network 110, a main stage 120, a first peak stage 130, a second peak stage 140 and an output network 150.

The input network 110 includes a splitter 112 which receives the input AC electrical signal 113, for example an RF signal to be amplified and supplied to an antenna, and supplies a portion of the input signal to each of the main, first peak and second peak stages. A first impedance 114 is provided between the input 102 and an input to the first peak amplifier 130 and is arranged to introduce a first phase shift of approximately −90° into the signal path at the operating frequency of the amplifier 100. As the amplifier 100 is intended to be a wideband amplifier, for example spanning the frequency range of approximately 1.8-2.2. GHz, then the nominal operating frequency of the amplifier 100 may be somewhere within that range and may be toward the centre of that range, for example 2.0 GHz. A second impedance 116 is provided between the input 102 and an input to the second peak amplifier 140 and is arranged to introduce a second phase shift of approximately 90° into the signal path.

As part of the output network 150, a third impedance 152 is provided between the output of the first peak amplifier 130 and the output 104 of the amplifier and is arranged to introduce a third phase shift of approximately 180° into the signal path. The impedance of the third impedance 152 at the operating frequency of the amplifier is approximately $Z_0$. A fourth impedance 154 is provided between the output of the main amplifier 120 and the output 104 of the amplifier and is arranged to introduce a third phase shift of approximately 90° into the signal path. The impedance of the fourth impedance 152 at the operating frequency of the amplifier is also approximately $Z_0$.

The operation of 3-way Doherty amplifiers is generally known in the art, but not the specific topology and mode of operation disclosed herein or illustrated by FIG. 1. Generally the main stage is operated in a first class of operation, often class AB or B, at a level of efficiency determined by its class of operation without either of the peak amplifiers operating. The first and second peak stages are biased to operate in a different class of operation, often class C. When the input voltage or power increases to a level just before the main stage begins to saturate, one or more of the peak amplifiers start to operate. Phase shifting components, are used so that the output load impedance seen by the main stage starts to decrease when the first and/or second peak stage starts to operate. This perceived impedance reduction allows the main stage to deliver more power. Hence, the maximum efficiency of the main stage is maintained until both of the peak amplifiers also reach saturation.

As noted above, the specific 3-way Doherty topology illustrated in FIG. 1, and its operation, are not known in the art. The second impedance 116 introduces a phase shift of 90° in the input path to the second peak stage and the fourth impedance introduces a phase shift of 90° in the output path from the main stage so that the currents from the second peak stage and main stage are in phase where they combine at the output 104 and so that power combining can be optimum. The net phase shift introduced by the first impedance 114 in the input signal path to the first peak stage and the third impedance 152 in the output signal path from the first peak stage 130 is 90° (−90°+180°. Hence, the currents from the first peak stage and main stage are in phase where they combine at the output 104 and the power combining can be optimum.

The operation of the circuit illustrated in FIG. 1 is generally as follows. When all three amplifiers 120, 130, 140 are switched on, the load impedance $Z_0/3$ is equally split between the three branches, so that each branch is loaded by $Z_0$. In this case, since the characteristic impedance of the output phase shifting elements 152, 154 is also $Z_0$, all three amplifiers 120, 130, 140 see the impedance $Z_0$ which corresponds to the optimum impedance for maximum power. As output power decreases, the first peak stage amplifier 130 is turned off first, as it has the lowest gate voltage, creating an open circuit condition at its output, and then at the output 104 owing to the 180° phase shift introduced by impedance 152. Now, the load $Z_0/3$ is equally split between the two remaining branches, so that each branch is loaded by $2*Z_0/3$, leading to the main amplifier stage 120 seeing $3*Z_0/2$. Then, as the output power continues to decrease, the second peak stage amplifier 140 is turned off, resulting in the main amplifier seeing the impedance $Z_{mod}=3*Z_0$. In this case, the output power of the main amplifier is three times less (or approximately −4.77 dB) than the maximum power operation for $Z_O$. Also, since the main amplifier stage 120 is the only amplifier that is turned on, and in the case that all of the amplifiers 120, 130, 140 are equal in size, then the power capability is also reduced by one third (or approximately −4.77 dB). Hence, the peak efficiency appears at approximately (−4.77 dB)+(−4.77 dB)=−9.54 dB. In practice, it may be convenient to use the same gate voltage for the first peak stage 130 and the second stage 140 amplifiers so that the intermediate step in efficiency does not appear and both peak stages start to turn off, and eventually turn off, together.

Implementing the circuit topology illustrated in FIG. 1 as an integrated circuit is not trivial. For example, the inherent drain-source capacitance of the transistors in the main stage and peak stages may reduce the performance of the amplifier.

Figure 2:
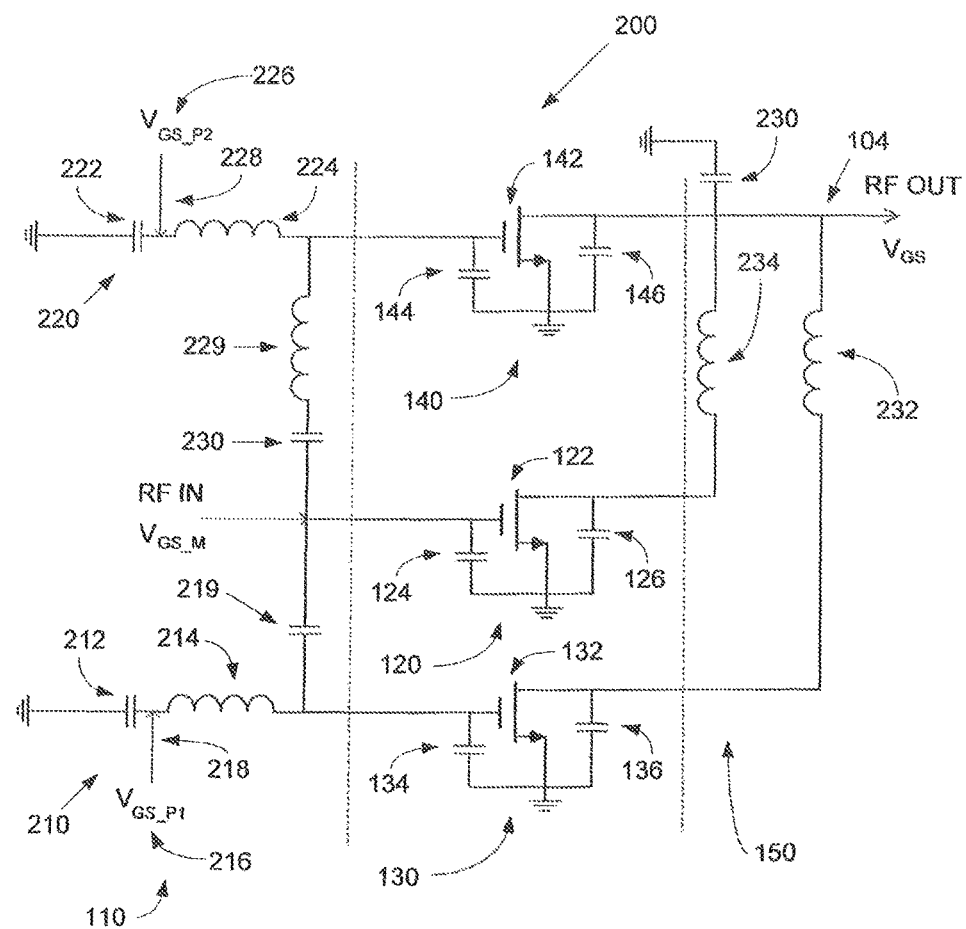
FIG. 2 shows a more detailed schematic circuit diagram of the 3-way Doherty amplifier of the invention.
Figure 3:
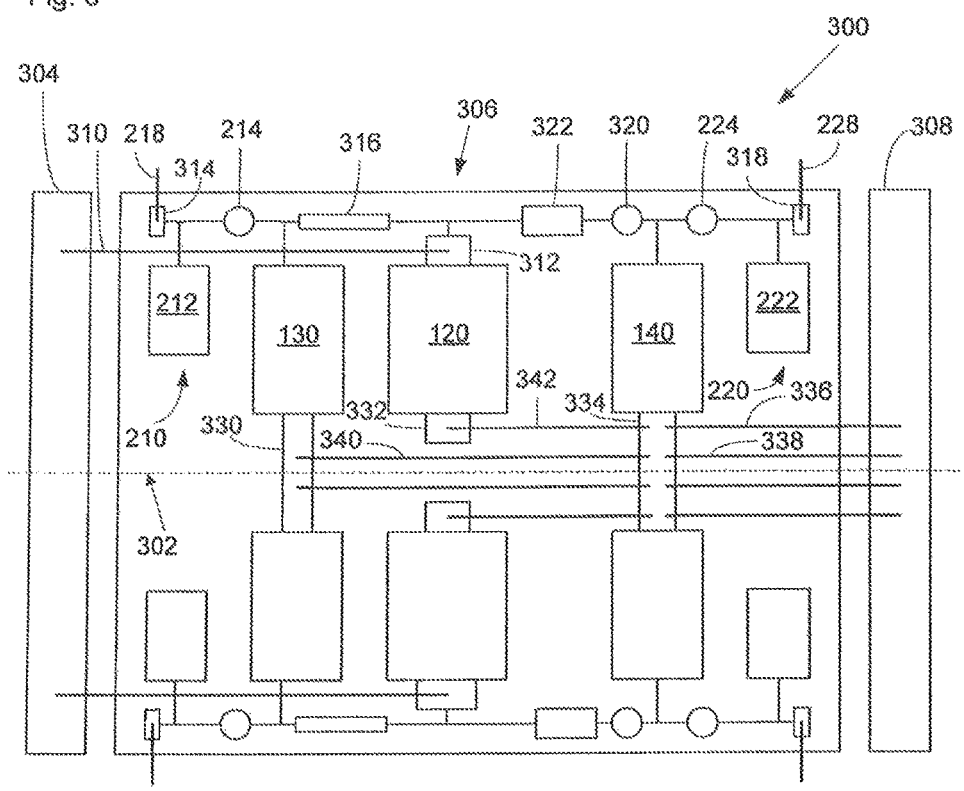
FIG. 3 shows the layout of an integrated circuit including two 3-way Doherty amplifiers of the invention.

FIG. 2 shows a further schematic equivalent circuit diagram 200 of the 3-way Doherty amplifier 100 realised on a die or semiconductor substrate and FIG. 3 shows a schematic layout of a die or semiconductor substrate 300 including a pair of 3-way Doherty amplifiers 100, 100' according to the invention. The die 300 is generally symmetric about centre line 302 and therefore only the parts in the upper half are labelled with reference numerals.

As illustrated in FIG. 2, the RF signal to be amplified 113, and a biasing signal for the main stage $V_{GS}\_M$ 120, are supplied at an input to the amplifier and a splitter 112 splits the input RF signal and supplies portions to the inputs of the main stage 120, first peak stage 130 and second peak stage 140.

The main stage 120 comprises a transistor 122, or a plurality of transistors, represented by transistor T1. Suitable transistors include FETs and in particular LDMOS FETs. Also illustrated in FIG. 2 are the inherent or parasitic gate-source capacitance 124 and drain-source capacitance 126 of the actual semiconductor transistor(s). Similarly, the first peak stage 130 comprises a transistor 132, or a plurality of transistors, represented by transistor T2. Suitable transistors include FETs and in particular LDMOS FETs. Also illustrated in FIG. 2 are the inherent or parasitic gate-source capacitance 134 and drain-source capacitance 136 of the actual semiconductor transistor(s). Also, the second peak stage 140 comprises a transistor 142, or a plurality of transistors, represented by transistor T0. Suitable transistors include FETs and in particular LDMOS FETs. Also illustrated in FIG. 2 are the inherent or parasitic gate-source capacitance 144 and drain-source capacitance 146 of the actual semiconductor transistor(s).

The input network 110 includes a first peak stage input network 210 which includes a capacitor 212 and an inductor 214 connected in series with the gate of the first peak stage. A first peak stage biasing signal $V_{GS}\_P1$ 216 is supplied by an electrical path 218 to a junction between the capacitor 212 and inductor 214 to set the class of operation of the first peak stage.

Generally speaking, the input parasitic capacitor, e.g. 134, of a transistor is significantly larger than its output parasitic capacitor, e.g. 136. For example, for LDMOS technology, the input parasitic capacitance can be a factor of approximately three times greater than the output parasitic capacitance. In the input network 210, the series arrangement of inductor 214 and capacitor 212 are connected to the input of the first peak stage amplifier 130. The input network capacitor 212 may have a first plate connected to the inductor 214 and a second plate for connecting to ground. This series arrangement of inductor and capacitor partially compensates for the input capacitance 134 of the transistor and thus permits adjustment of the characteristics (impedance and phase shift values) of the input phase shifting impedance 114 so that it complements the characteristics of the output phase shifting impedance 152. Also, this input network 210 series arrangement provides a node where the RF amplitude is relatively low (sometimes referred to as an RF cold point) which may conveniently be used as an input for supplying the bias signal 216 to the amplifier.

Input network 110 also includes a first phase shifting component in the form of phase shifting capacitor 219 connected between the splitter 112 and the gate of the transistor 132 after inductor 214. Phase shifting capacitor 219 is part of a Pi network formed also by the parasitic shunt capacitor to ground 124 of the main stage transistor 120 and the shunt parasitic capacitor to ground 134 of the first peak stage transistor 130. The Pi network formed by the phase shifting capacitor 219 and the parasitic shunt capacitors 124, 134 of the main and first peak stage transistors provide the first phase shifting impedance 114 and realise the −90° phase shift. The phase shifting capacitor 219 also acts as a DC block which allows the main 120 and first peak 130 transistors to work at different gate voltages by blocking the respective gate biasing DC signals 216, 113.

The input network 110 also includes a second peak stage input network 220 which includes a capacitor 222 and an inductor 224 connected in series with the gate of the second peak stage. A second peak stage biasing signal $V_{GS}\_P2$ 226 is supplied by an electrical path 228 to a junction between the capacitor 222 and inductor 224 to set the class of operation of the second peak stage. The second peak stage input network 220 is provided for similar reasons to the first peak stage input network 210 described above.

Input network 110 also includes a second phase shifting component in the form of phase shifting inductor 229 connected via a further DC blocking capacitor 230 between the splitter 112 and the gate of the transistor 142 after inductor 224. Phase shifting inductor 229 is part of a further Pi network formed also by the parasitic shunt capacitor to ground 124 of the main stage transistor 120 and the shunt parasitic capacitor to ground 144 of the second peak stage transistor 140. The Pi network formed by the phase shifting inductor 229 and the parasitic shunt capacitors 124, 144 of the main and second peak stage transistors provide the second phase shifting impedance 116 and realise the 90° phase shift. The further capacitor 230 is not used to provide phase shifting but acts as a further DC block which allows the main 120 and second peak 130 transistors to work at different gate voltages by blocking the respective gate biasing DC signals 226, 113

The output network 150 includes third phase shifting component in the form of inductor 232 connected between the drain of the first peak stage and the output 104. An output capacitor 236 may optionally be provided (depending on the transistor technology) connected between the output 104 and ground. A Pi network formed by the parasitic drain-source shunt capacitor to ground 136 of the first peak stage transistor 130, the inductor 232, and the parasitic drain-source shunt capacitor to ground 146 of the second peak stage transistor 140 in parallel with the output capacitor 236 provides the third phase shifting impedance 152 with 180° phase shift and impedance $Z_O$ The output network further comprises a fourth phase shifting component in the form of inductor 234 connected between the drain of the main stage and the output 104. A Pi network formed by the parasitic drain-source shunt capacitor to ground 126 of the main stage transistor 120, the inductor 234, and the parasitic drain-source shunt capacitor to ground 146 of the second peak stage transistor 140 in parallel with the output capacitor 236 provides the fourth phase shifting impedance 154 with 90° phase shift and impedance $Z_0$ Referring now to FIG. 3, there is shown a schematic block diagram of a package 300 including an input lead frame 304, a die 306 including a pair of integrated 3-way Doherty amplifiers and an output lead frame 308. As noted above, die 306 includes a pair of 3-way Doherty amplifiers each having a topology corresponding to the circuit diagrams of FIGS. 1 and 2. Input lead frame 304 includes a bond wire 310 extending between the input lead frame 304 and a bond pad 312 electrically connected to the gate of the main stage 120 and which provides the splitter 112. The RF input signal RFIN and main stage biasing voltage $V_{GS\_M}$ can be supplied by bond wire 310.

First peak stage input network 210 includes capacitor 212 and inductor 214, which may be realised as integrated circuit components and electrical connector 218 connected to bond pad 314 to supply the first peak stage biasing voltage. First phase shifting component 219 is formed by capacitor 316, which may be realised as an integrated circuit component, connected between splitter 312 and the gate of the first peak stage 130.

Second peak stage input network 220 includes capacitor 222 and inductor 224, which may be realised as integrated circuit components and electrical connector 228 connected to bond pad 318 to supply the second peak stage biasing voltage. Second phase shifting component 229 is formed by inductor 320 connected in series with DC blocking capacitor 322 which may be realised as integrated circuit components connected between splitter 312 and the gate of the second peak stage 150.

A first peak stage bond pad 330 is connected to the drain of the first peak stage 130, a main stage bond pad 332 is connected to the drain of the main stage 120 and a second peak stage bond pad 334 is connected to the drain of the second peak stage. The second peak stage bond pad 334 is connected to the output lead frame 308 by first and second output bond wires 336, 338 and provides an output signal path for the amplified RF signal RFOUT. A further bond wire 340 is connected between first peak stage bond pad 330 and the second peak stage bond pad 334 and realises third inductor 152 providing a phase shift of 180°. A yet further bond wire 342 is connected between main stage bond pad 332 and second peak stage bond pad 334 and realises the fourth inductor 154 providing a phase shift of 90°.

It should be noted that bond wires 310, 336, 338, 340 and 342 are merely representative and that in practice they may be realised using arrays of multiple bond wires.

The transistor layout arrangement illustrated in FIG. 3 can be parallelized on the same die to reach higher power capability (for example greater than 100 W). Depending on the output power capability required, several of such dies can be used in a conventional metal-ceramic package or in its over moulded counterpart. Various different types of power transistor technologies can be used for the main and peak stages, such as LDMOS and GaN technologies Amplifiers can be produced operating from about 500 MHz to about 5 GHz, depending on the target application.

The layout of the integrated 3-way Doherty amplifier illustrated in FIG. 3 has a number of features.

Figure 4:
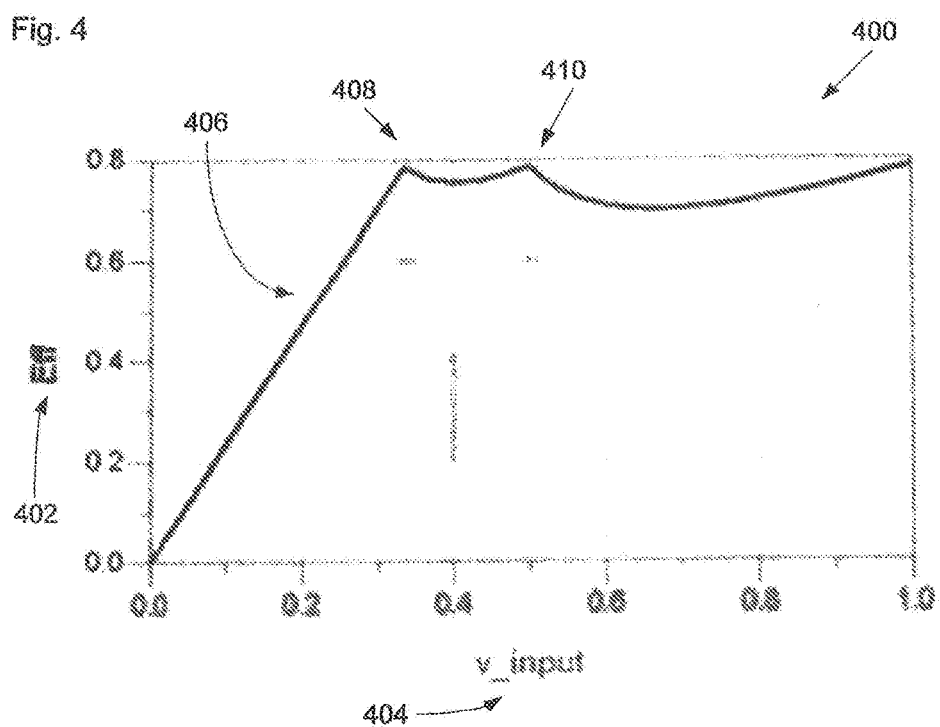
FIG. 4 shows a graph illustrating the efficiency of the 3-way Doherty amplifier of the invention.

Firstly, it utilises a combining circuit that enables load-line modulation over the full dynamic range of the main amplifier. Phase shifts of −90° and 90° are provided at the inputs of the first peak stage and second peak stage respectively. Load line modulation provides an efficiency response like that illustrated in FIG. 4. FIG. 4 shows a graph 400 illustrating the efficiency 402 of the 3-way Doherty amplifier as a function of the drive signal strength 404. As can be seen, line 406 has a first peak 408 at an efficiency of close to 80% and corresponding to a back-off or about 9.5 dB. This first peak 408 corresponds to a one of the first peak stage 130 or second peak stage 140 becoming operational. A second peak 410 also exist also at an efficiency of close to 80% and corresponding to a back-off of about 6 dB and corresponds to the other of the first peak stage and second peak stage becoming operational. Hence, at the back-off typically required for telecommunications applications, about 8 dB, the 3-way Doherty amplifier of the invention has an enhanced efficiency.

Further, as can most easily be seen in FIG. 1, the 3-way Doherty amplifier topology of the invention uses two phase shifting elements 152, 154 on the output side, as opposed to three in other 3-way Doherty topologies. A benefit of this is that it reduces electromagnetic coupling between the bond wires from the peak stages and the main stage. As illustrated in FIG. 3, the layout of the components means that coupling is limited to any coupling between bond wires 340 and 342. Substantially the same signal, in terms of voltage and current, is present on bond wires 336 and 338 and so coupling is absent or less of an issue for these bond wires. There can be mutual inductive coupling caused by current loops formed by the bond wires 342 and 340 which gives rise to further impedance in the output of the amplifier which can be difficult to reduce by impedance matching techniques. However, reducing any electromagnetic coupling between bond wires 342 and 340 can make it easier to impedance match the amplifier to its load 106. Further, the input combining for the main stage and first peak stage, and which provides the −90° offset, can be realized using a single series capacitor 316 and does not use any series inductor. This results in a higher gain for the amplifier as integrated inductors can present a significant loss, for example, a Q of about 5 at 2 GHz for low-resistivity silicon technologies.

Figure 5:
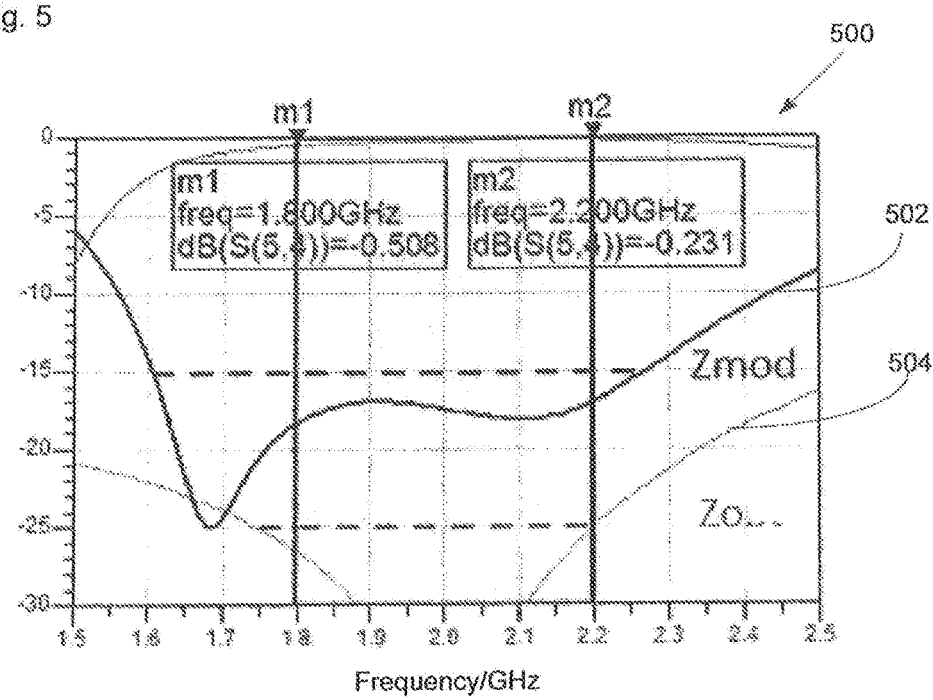
FIG. 5 shows a graph illustrating the simulated return loss response for the peak power impedance condition and the 9.5 dB back-off impedance condition of the 3-way Doherty amplifier of the invention.
Figure 6:
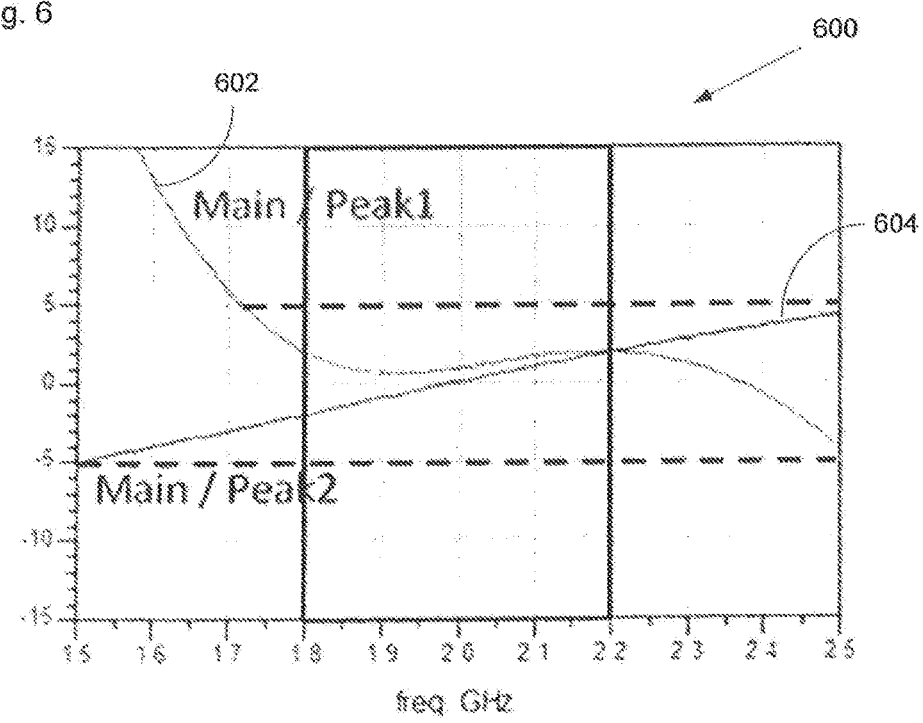
FIG. 6 shows a graph illustrating the simulated input to output phase alignment properties of the 3-way Doherty amplifier of the invention.

The expected behaviour of devices made according to the layout of FIG. 3 has been simulated and the results are illustrated in FIGS. 5 and 6 which confirm the wideband capability of such an amplifier.

For example FIG. 5 shows a graph 500 illustrating the simulated impedance matching behaviour of an amplifier over a bandwidth of 0.4 GHz, from approximately 1.8 GHz to 2.2 GHz. Line 502 shows the return loss response in dB for the $Z_{mod}$ impedance condition corresponding to the impedance seen by the main amplifier 120 when the first and second peak amplifiers 130, 140 are both off and is three times the impedance at peak power ($Z_0$) when all three amplifiers are on. Zmod can be seen to be better than −15 dB in the band. Line 504 shows the simulated high power impedance matching between the amplifier and a load with impedance $Z_0$ which is better than −25 dB in the band.

Similarly, FIG. 6 shows a graph 600 illustrating the simulated phase alignment behaviour of input and output signals of an amplifier over a bandwidth of 0.4 GHz, from approximately 1.8 GHz to 2.2 GHz. Line 602 shows the phase alignment between the input and output signals of the main stage and first peak stage which is within about two degrees over the band. Line 604 shows the phase alignment between the input and output signals of the main stage and second peak stage which varies from about −2 to about +2 degrees over the band.

Hence, the integrated 3-way Doherty amplifier provides many of the benefits of a symmetric integrated Doherty topology (such as being compact, easy to implement, repeatable, wideband performance) together with the back-off efficiency advantages of a 3-way Doherty topology.

Such amplifiers have a wide range of applications for example as power amplifiers and are particularly suitable for use in base station RF power amplifiers.

The 3-way Doherty amplifier of the invention is particularly suitable for use in an RF power amplifier. One area in which RF power amplifiers can be used is in telecommunications base stations owing to the range of RF frequency electrical signals used and the high electrical signal powers that are needed in order to drive the antenna.

Figure 7:
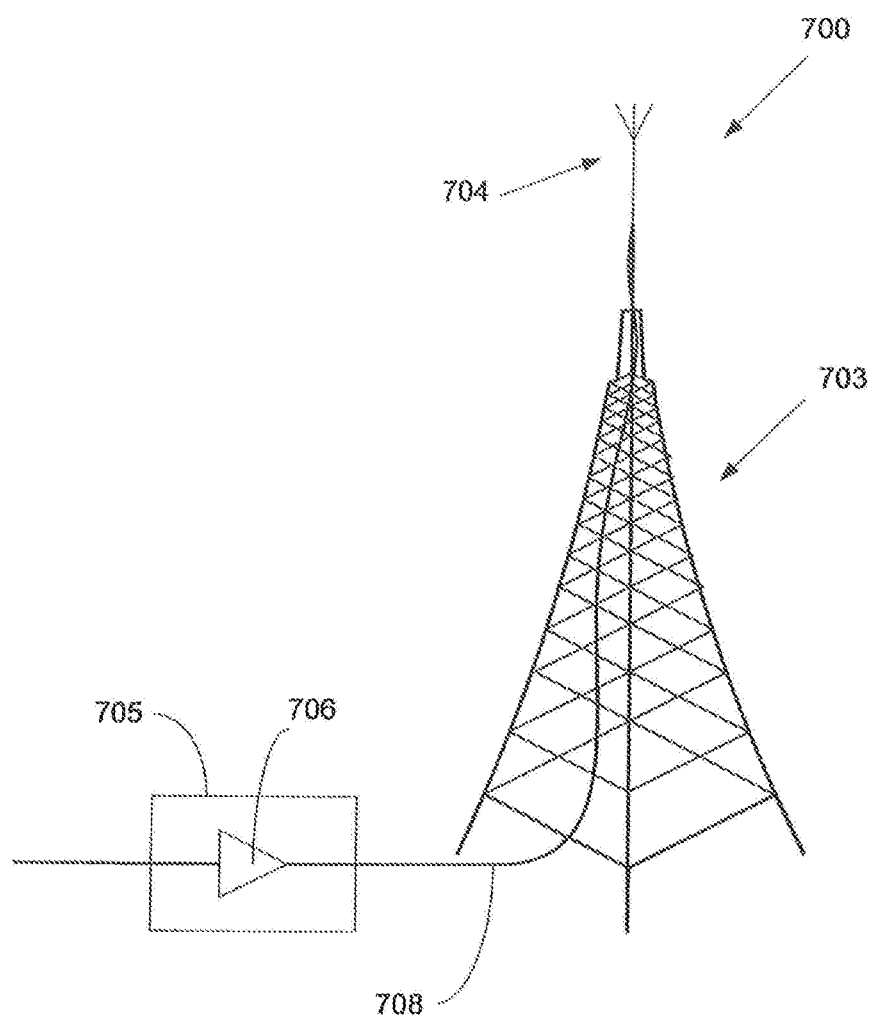
FIG. 7 shows a schematic block diagram of a telecommunications base station according to an aspect of the invention, including an RF power amplifier according to an aspect of the invention and including a 3-way Doherty amplifier according to the invention.

For example, FIG. 7 shows a schematic block diagram of a telecommunications base station 700 including a tower or pylon 702 supporting an antenna 704, which may include transmitting and receiving antennae. The base station 700 is connected to the rest of the telecommunications infrastructure and will typically include a number of electronics elements 705, such as one or more amplifiers 706, radio transceivers, RF combiners, control elements, communications elements and a backup power supply. The transmitter output side of the radio transceivers is supplied to a high power RF amplifier 706 with a typical power of 10 to 50 Watts which amplifies the signals to produce a higher power RF signal sufficient to drive the transmitter antenna. The amplified RF signal is passed to the transmitter antenna 704 by a cable 708. The RF power amplifier 706 can include one or a plurality of integrated 3-way Doherty amplifiers according to the invention. For example, six amplifiers may be used as 6-pipe amplifiers are common in base station applications.

One of ordinary skill in the art would recognize other variants, modifications and alternatives to the specific embodiments described in light of the foregoing discussion.

We claim:

1. A die comprising at least one integrated 3-way Doherty amplifier, the integrated 3-way Doherty amplifier comprising:
   a main stage;
   a first peak stage;
   a second peak stage;
   an input connected to an input network which is connected to the main stage, first peak stage and second peak stage, wherein the input network includes a first impedance connected to an input of the first peak stage and providing a −90° phase shift and a second impedance connected to an input of the second peak stage and providing a 90° phase shift;
   an output connected to an output network which is connected to the main stage, first peak stage and second peak stage, wherein the output network includes a third impedance connected to the output of the first peak stage and providing a 180° phase shift and a fourth impedance connected to the output of the main stage and providing a 90° phase shift;
   a first pi-network formed by a parasitic drain-source shunt capacitor to ground of the first peak stage, the at least one first bond wire, and the parasitic drain-source shunt capacitor to ground of the second peak stage, said first pi-network being configured for providing the third phase shifting impedance; and
   a second pi-network formed by a parasitic drain-source shunt capacitor to ground of the main stage, the at least one second bond wire, and the parasitic drain-source shunt capacitor to ground of the second peak stage, said second pi-network being configured for providing the fourth phase shifting impedance; and
   the die optionally comprising an output capacitance connected in between the output of the die and ground,
   wherein the third impedance comprises at least one first bond wire connected between an output of the first peak stage and the output of the second peak stage and the fourth impedance comprises at least one second bond wire connected between an output of the main stage and the output of the second peak stage.

2. The die of claim 1, wherein the at least one first bond wire is longer than the at least one second bond wire.

3. The die of claim 2, wherein the first peak stage is located closer to the input of the amplifier than the second peak stage and wherein the main stage is located between the first peak stage and the second peak stage.

4. The die of claim 1, wherein the third impedance and the fourth impedance both present the same impedance.

5. The die of claim 1, wherein the 3-way Doherty amplifier has a fractional bandwidth of 20%.

6. The die of claim 1, wherein the 3-way Doherty amplifier has a bandwidth extending from 1.8 GHz to 2.2 GHz.

7. The die of claim 1 and further comprising a further 3-way Doherty amplifier, wherein the further 3-way Doherty amplifier is the same as the 3-way Doherty amplifier, but arranged in mirror image.

8. An amplifier package comprising:
   an input lead frame;
   an output lead frame; and
   a die as claimed in claim 1.

9. A power amplifier including at least one amplifier package as claimed in claim 8.

10. A telecommunications base station including at least one power amplifier as claimed in claim 9.

* * * * *